US011728351B2

(12) United States Patent
Shin et al.

(10) Patent No.: US 11,728,351 B2
(45) Date of Patent: Aug. 15, 2023

(54) DISPLAY DEVICE

(71) Applicant: LG Display Co., Ltd., Seoul (KR)

(72) Inventors: Sung Soo Shin, Anyang-si (KR); Won Sang Ryu, Goyang-si (KR); Sang Gul Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 128 days.

(21) Appl. No.: 17/353,451

(22) Filed: Jun. 21, 2021

(65) Prior Publication Data

US 2021/0408061 A1     Dec. 30, 2021

(30) Foreign Application Priority Data

Jun. 30, 2020    (KR) .................. 10-2020-0080576

(51) Int. Cl.
  *H01L 27/12*     (2006.01)
  *G09G 3/20*      (2006.01)
(52) U.S. Cl.
  CPC ............. *H01L 27/124* (2013.01); *G09G 3/20* (2013.01); *G09G 2310/0272* (2013.01)
(58) Field of Classification Search
  CPC .............................. H01L 27/124; G09G 3/20
  See application file for complete search history.

(56) References Cited

U.S. PATENT DOCUMENTS

| 8,673,426 B2 | 3/2014 | Yamazaki et al. |
| 8,822,999 B2 | 9/2014 | Choi et al. |
| 8,970,999 B2 | 3/2015 | Yamazaki et al. |

(Continued)

FOREIGN PATENT DOCUMENTS

| CN | 106128961 A | 11/2016 |
| CN | 107591410 A | 1/2018 |

(Continued)

OTHER PUBLICATIONS

Japan Patent Office, Notice of Reasons for Refusal, JP Oatent Application No. 2021-103882, dated Jul. 5, 2022, eight pages.

(Continued)

*Primary Examiner* — James A Dudek
(74) *Attorney, Agent, or Firm* — Fenwick & West LLP

(57) ABSTRACT

Disclosed is a display device including a substrate including display and non-display areas, a first thin-film transistor located in the non-display area, and second and third thin-film transistors located in the display area. The first thin-film transistor includes a first semiconductor pattern, a first gate electrode overlapping the first semiconductor pattern, and first source and first drain electrodes connected to the first semiconductor pattern. The second thin-film transistor includes second and third semiconductor patterns including a first oxide semiconductor, a second gate electrode overlapping the second semiconductor pattern, a third gate electrode overlapping the third semiconductor pattern, and second source and second drain electrodes connected to the second and third semiconductor patterns. The third thin-film transistor includes a fourth semiconductor pattern including a first oxide semiconductor, a fourth gate electrode overlapping the fourth semiconductor pattern, and third source and third drain electrodes connected to the fourth semiconductor pattern.

19 Claims, 10 Drawing Sheets

(56) References Cited

U.S. PATENT DOCUMENTS

| | | |
|---|---|---|
| 8,981,374 B2 | 3/2015 | Kubota et al. |
| 9,515,065 B2 | 12/2016 | Yamazaki et al. |
| 9,985,082 B2 | 5/2018 | Lee et al. |
| 9,997,514 B2 | 6/2018 | Yamazaki et al. |
| 10,388,710 B2 | 8/2019 | Lee et al. |
| 2013/0002312 A1 | 1/2013 | Yamazaki et al. |
| 2013/0026475 A1 | 1/2013 | Choi et al. |
| 2014/0110714 A1* | 4/2014 | Ye ............... H01L 29/78693 423/594.18 |
| 2014/0185170 A1 | 7/2014 | Yamazaki et al. |
| 2014/0209897 A1 | 7/2014 | Kubota et al. |
| 2015/0021599 A1* | 1/2015 | Ridgeway ......... H01L 29/247 257/43 |
| 2015/0243647 A1 | 8/2015 | Yamazaki et al. |
| 2016/0189611 A1 | 6/2016 | Jinta |
| 2017/0148781 A1 | 5/2017 | Yamazaki et al. |
| 2018/0012947 A1 | 1/2018 | Lee et al. |
| 2018/0233575 A1 | 8/2018 | Kim et al. |
| 2018/0240855 A1 | 8/2018 | Lee et al. |
| 2019/0273168 A1* | 9/2019 | Matsukizono ...... H01L 27/1251 |

FOREIGN PATENT DOCUMENTS

| | | |
|---|---|---|
| CN | 109716533 A | 5/2019 |
| JP | 2014-199428 A | 10/2014 |
| JP | 2018-174352 A | 11/2018 |
| KR | 10-2013-0008461 A | 1/2013 |
| KR | 10-2021-0086275 A | 7/2021 |
| TW | 201306246 A | 2/2013 |
| TW | 201308571 A | 2/2013 |
| WO | WO 2018/056117 A1 | 3/2018 |

OTHER PUBLICATIONS

Taiwan Intellectual Property Office, Office Action, TW Patent Application No. 110123790, dated Jul. 28, 2022, 30 pages.

Intellectual Property Office of the United Kingdom, Office Action, GB Patent Application No. 2109292.9, dated Nov. 10, 2021, six pages.

Office Action, Intellectual Property India Patent Application No. 202114027945, dated Apr. 4, 2022, 6 pages.

Japan Patent Office, Office Action, JP Patent Application No. 2021-103882, dated Jan. 17, 2023, eight pages.

* cited by examiner

200(210,211,212,213)
300(310,311,312,313)
400(410,411,412,413,414,415)
500(510,511,512,513)
600(610,611,612)
700(710,711,712)

Condition I (① W/L ② W/L)
Condition II (① W/L ② W/2L)
Condition III (① 2W/L ② W/L)

DISPLAY DEVICE

CROSS-REFERENCE TO RELATED APPLICATION

This application claims the benefit of Republic of Korea Patent Application No. 10-2020-0080576, filed on Jun. 30, 2020, which is hereby incorporated by reference in its entirety.

BACKGROUND

Field of Technology

The present disclosure relates to a display device including different types of thin-film transistors.

Discussion of the Related Art

With the advent of the information age in recent years, various kinds of display devices for displaying images have been developed. Among these display devices, there is a display device in which light-emitting elements that are self-luminous are formed on a display panel, obviating the necessity to dispose a backlight unit outside the display panel.

In addition, the display device in which light-emitting elements are formed on a display panel includes an array substrate in which a plurality of pixels is defined in a display area in which an image is displayed, with at least one thin-film transistor mounted in each of subpixels of each of the plurality of pixels.

For example, the array substrate includes, in each subpixel, a driving thin-film transistor, which supplies driving current to a light-emitting element, and a switching thin-film transistor, which supplies a gate signal to the driving thin-film transistor.

Meanwhile, the array substrate of the display device needs to be designed such that the driving thin-film transistor advantageously achieves grayscale expression and the switching thin-film transistor has a good on/off ratio. The reason for this is that the ability of the driving thin-film transistor to express grayscale improves as the ratio of variation in current to variation in voltage is smaller, and that the switching thin-film transistor needs to be rapidly turned on and off.

However, because the driving thin-film transistor and the switching thin-film transistor, which are disposed on the array substrate, include the same semiconductor material and thus have the same characteristics, it is difficult to design the driving thin-film transistor and the switching thin-film transistor such that the characteristics thereof are different from each other in consideration of the characteristics of the thin-film transistors.

Further, when designing a plurality of transistors having different semiconductors, the process of manufacturing the same may become complicated, and the cost of manufacturing the same may increase.

SUMMARY

It is an object of the present disclosure to provide a display device in which thin-film transistors having different respective characteristics are disposed together on an array substrate, whereby the performance of the display device is improved.

It is another object of the present disclosure to provide a display device in which an oxide semiconductor is applied to an active layer, whereby a thin-film transistor including a single active layer and a top gate and a thin-film transistor including dual active layers and double gates can be used for a switching transistor or a driving transistor.

It is still another object of the present disclosure to provide a display device including thin-film transistors having different respective operation characteristics by configuring the thin-film transistors so as to have different respective values of current in a saturation region when a driving-current curve (an output curve or an Ids-Vd curve) or an I-V curve (a transfer curve or an Ids-Vgs curve) is measured.

It is still another object of the present disclosure to provide a display device including a plurality of thin-film transistors exhibiting different values (S-factors) of the ratio of variation in current to variation in voltage and thus having different respective operation characteristics.

The above and other objects can be accomplished by the provision of a display device according to an embodiment of the present disclosure.

A display device according to an embodiment of the present disclosure may include a substrate including a display area and a non-display area, a first thin-film transistor located in the non-display area, and second and third thin-film transistors located in the display area.

The first thin-film transistor may include a first semiconductor pattern including a first poly silicon, a first gate electrode overlapping the first semiconductor pattern, and first source and first drain electrodes connected to the first semiconductor pattern.

The second thin-film transistor may include second and third semiconductor patterns including a first oxide semiconductor, a second gate electrode overlapping the second semiconductor pattern, a third gate electrode overlapping the third semiconductor pattern, and second source and second drain electrodes connected to the second and third semiconductor patterns through a contact hole.

The third thin-film transistor may include a fourth semiconductor pattern including a first oxide semiconductor, a fourth gate electrode overlapping the fourth semiconductor pattern, and third source and third drain electrodes connected to the fourth semiconductor pattern.

A display device according to another embodiment of the present disclosure may include a substrate including a display area and a non-display area, a driving circuit unit located in the non-display area, and a pixel unit located in the display area. The pixel unit may include a switching transistor and a driving transistor configured to have different respective structures.

The driving transistor may include a first active layer including source/drain regions and a channel region, a second active layer located above the first active layer, source/drain electrodes located above the second active layer and connected to the source/drain regions of the first active layer and the source/drain regions of the second active layer, a lower gate electrode located below the first active layer, and an upper gate electrode located above the second active layer. The source/drain regions of the first active layer may be connected to the source/drain electrodes through a first contact hole, the source/drain regions of the second active layer may be connected to the source/drain electrodes through a second contact hole, and the first contact hole may be located farther away from the upper gate electrode than the second contact hole.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
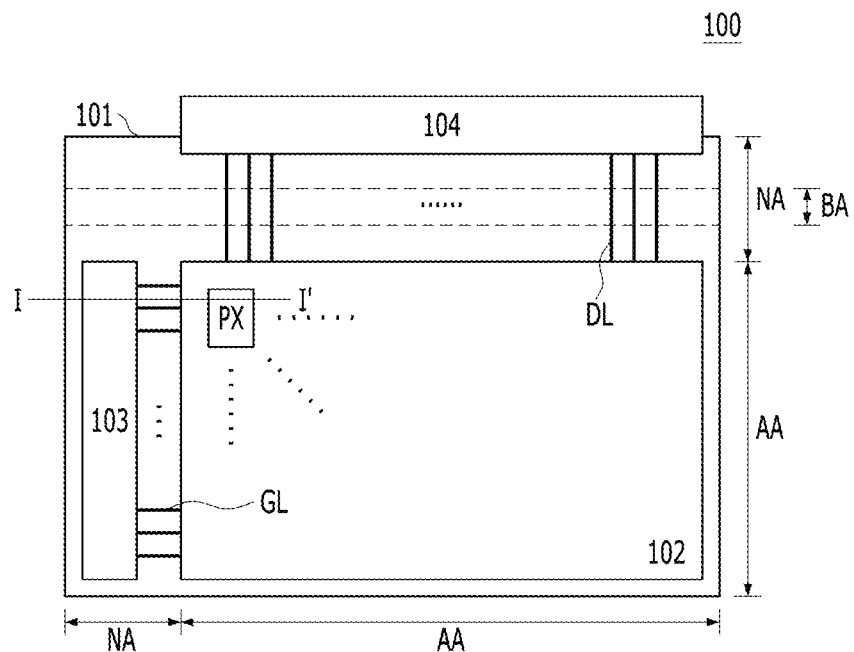
FIG. 1 is a schematic view of a display device according to an embodiment of the present disclosure.

Advantages and features of the present disclosure and methods for achieving them will be made clear from embodiments described below in detail with reference to the accompanying drawings. The present invention may, however, be embodied in many different forms, and should not be construed as being limited to the embodiments set forth herein. Rather, these embodiments are provided so that this disclosure will be thorough and complete, and will fully convey the scope of the invention to those skilled in the art. The present invention is defined only by the scope of the claims.

In the drawings for explaining the exemplary embodiments of the present disclosure, for example, the illustrated shape, size, ratio, angle, and number are given by way of example, and thus, are not limited to the disclosure of the present disclosure. Throughout the present specification, the same reference numerals designate the same constituent elements. In addition, in the following description of the present invention, a detailed description of known functions and configurations incorporated herein will be omitted when it may make the subject matter of the present invention rather unclear.

The terms "comprises," "includes," and/or "has", used in this specification, do not preclude the presence or addition of other elements unless used along with the term "only". The singular forms are intended to include the plural forms as well, unless the context clearly indicates otherwise.

In the interpretation of constituent elements included in the various embodiments of the present invention, the constituent elements are interpreted as including an error range even if there is no explicit description thereof.

In the description of the various embodiments of the present disclosure, when describing positional relationships, for example, when the positional relationship between two parts is described using "on", "above", "below", "next to", or the like, one or more other parts may be located between the two parts unless the term "directly" or "closely" is used.

Spatially relative terms such as "below", "beneath", "lower", "above", and "upper" may be used herein to describe one element's or constituent component's relationship to another element or constituent component as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements would then be oriented "above" the other elements. The exemplary term "below" or "beneath" can, therefore, encompass both an orientation of above and below. Similarly, the exemplary term "above" or "upper" can encompass both an orientation of above and below.

In the description of the various embodiments of the present disclosure, when describing temporal relationships, for example, when the temporal relationship between two actions is described using "after", "subsequently", "next", "before", or the like, the actions may not occur in succession unless the term "directly" or "just" is used therewith.

It may be understood that, although the terms "first", "second", etc. may be used herein to describe various elements, these elements are not to be limited by these terms. These terms are merely used to distinguish one element from another. Therefore, in the present specification, an element indicated by "first" may be the same as an element indicated by "second" without exceeding the technical scope of the present invention, unless otherwise mentioned.

The term "at least one" should be understood as including all possible combinations which can be suggested from one or more relevant items. For example, the meaning of "at least one of a first item, a second item, or a third item" may be each one of the first item, the second item, or the third item and also be all possible combinations that can be suggested from two or more of the first item, the second item, and the third item.

The respective features of the various embodiments of the present disclosure may be partially or entirely coupled to and combined with each other, and various technical linkages and modes of operation thereof are possible. These various embodiments may be performed independently of each other, or may be performed in association with each other.

It should be noted that when reference numerals are assigned to the elements of the drawings, the same or similar elements are denoted by the same reference numerals even when they are depicted in different drawings.

In the embodiments of the present disclosure, a source electrode and a drain electrode are distinguished from each other for convenience of explanation. However, the source electrode and the drain electrode may be interchanged. The source electrode may be the drain electrode, and the drain electrode may be the source electrode. Also, the source electrode in any one embodiment may be the drain electrode in another embodiment, and the drain electrode in any one embodiment may be the source electrode in another embodiment.

In one or more embodiments of the present disclosure, for convenience of explanation, a source region is distinguished from a source electrode, and a drain region is distinguished from a drain electrode. However, embodiments of the present disclosure are not limited thereto. For example, a source region may be a source electrode, and a drain region may be a drain electrode. Also, a source region may be a drain electrode, and a drain region may be a source electrode.

The respective features of the various embodiments of the present disclosure may be partially or entirely coupled to and combined with each other, and can be interlocked and operated in various technical ways, as will be fully understood by a person having ordinary skill in the art, and the embodiments can be carried out independently of or in association with each other.

Hereinafter, various embodiments of the present invention will be described in detail with reference to the accompanying drawings.

FIG. 1 is a plan view showing a display device 100 according to the present disclosure.

The display panel 102 has an active area AA disposed on a substrate 101 and a non-active area NA disposed adjacent to the active area AA. The substrate 101 is formed of a flexible plastic material so as to be bendable in one embodiment. For example, the substrate 101 is formed of polyimide (PI), polyethylene terephthalate (PET), polyethylene naphthalate (PEN), polycarbonate (PC), polyethersulfone (PES), polyacrylate (PAR), polysulfone (PSF), or cyclic-olefin copolymer (COC).

A subpixel in the active area AA includes a thin-film transistor having an oxide semiconductor layer.

At least one of a data-driving unit 104 or a gate-driving unit 103 may be disposed in the non-active area NA, and the substrate 101 may further include a bending area BA, which is bent in the non-active area NA. The gate-driving unit 103 may be directly formed on the substrate 101 using a thin-film transistor having a polycrystalline semiconductor layer.

The thin-film transistor having an oxide semiconductor layer and the thin-film transistor having a polycrystalline semiconductor layer have high electron mobility, and are therefore capable of exhibiting high resolution and of being driven with low power.

A plurality of data lines DL and a plurality of gate lines GL may be disposed in the active area AA. For example, the plurality of data lines DL may be disposed in rows or columns, and the plurality of gate lines GL may be disposed in columns or rows. In addition, subpixels PX may be disposed in regions defined by the data lines and the gate lines.

The gate-driving unit 103 including a gate-driving circuit may be disposed in the non-active area NA. The gate-driving circuit of the gate-driving unit 103 sequentially supplies a scan signal to the plurality of gate lines GL, thereby sequentially driving the pixel rows. Here, the gate-driving circuit may also be referred to as a scan-driving circuit. In addition, the pixel row refers to pixels connected to one gate line.

The gate-driving circuit may be composed of a thin-film transistor having a polycrystalline semiconductor layer, may be composed of a thin-film transistor having an oxide semiconductor layer, or may be composed of both a thin-film transistor having a polycrystalline semiconductor layer and a thin-film transistor having an oxide semiconductor layer. When the semiconductor layer of the thin-film transistor of the gate-driving circuit and the semiconductor layer of the thin-film transistor disposed in the subpixel in the active area AA include the same material, they may be formed simultaneously through the same process.

The gate-driving circuit may include a shift register and a level shifter.

In the display device according to the embodiment of the present disclosure, the gate-driving circuit may be implemented in a gate-in-panel (GIP) type, and may be directly disposed on the substrate 101.

The gate-driving unit 103 including the gate-driving circuit sequentially supplies a scan signal having an on voltage or an off voltage to the plurality of gate lines.

The display device 100 according to the embodiment of the present disclosure may further include a data-driving circuit. When a specific gate line is opened by the gate-driving unit 103 including the gate-driving circuit, the data-driving circuit converts image data into an analog-type data voltage, and supplies the analog-type data voltage to the plurality of data lines.

The plurality of gate lines GL disposed on the substrate 101 may include a plurality of scan lines and a plurality of emission control lines. The plurality of scan lines and the plurality of emission control lines are wires that transmit different types of gate signals (scan signals and emission control signals) to gate nodes of different types of transistors (scan transistors and emission control transistors).

The gate-driving unit 103 including the gate-driving circuit may include a scan-driving circuit, which outputs scan signals to a plurality of scan lines, which are one kind of gate lines GL, and an emission-driving circuit, which outputs emission control signals to a plurality of emission control lines, which are the other kind of gate lines GL.

The data lines DL may be disposed so as to pass through the bending area BA. Various data lines DL may be disposed so as to be connected to a data pad PAD.

The bending area BA may be an area in which the substrate 101 is bent. The substrate 101 may be configured to be maintained in a flat state without being bent in an area other than the bending area BA and to be bent in the bending area BA. Accordingly, two non-bent areas of the substrate 101, which are isolated from each other, with the bending area BA of the substrate 101 interposed therebetween, may face each other.

Figure 2A:
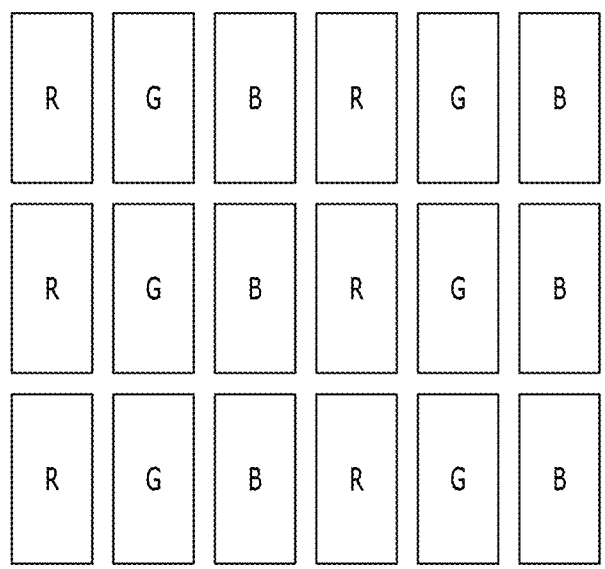
FIGS. 2A and 2B are plan views showing subpixels disposed in the active area AA shown in FIG. 1 according to an embodiment of the present disclosure.
Figure 2B:
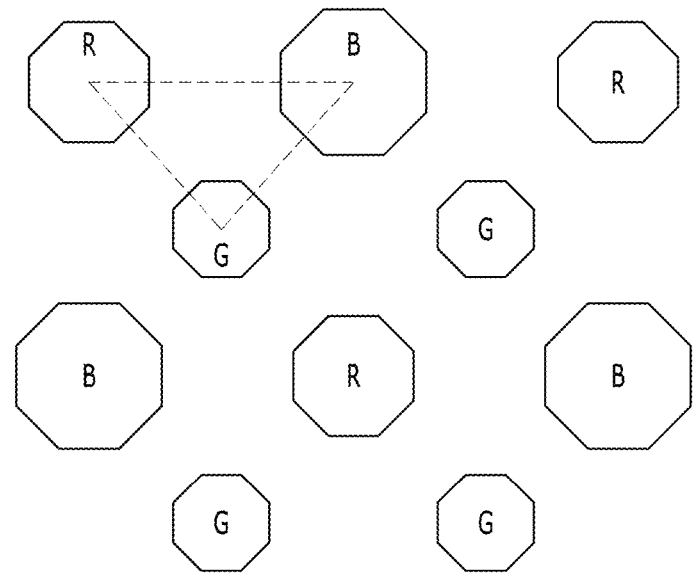

FIGS. 2A and 2B are plan views showing the subpixels disposed in the active area AA shown in FIG. 1.

The active area AA displays an image through unit pixels arranged in a matrix form. Each of the unit pixels includes a red (R) subpixel, a green (G) subpixel, and a blue (B) subpixel, or includes a red (R) subpixel, a green (G) subpixel, a blue (B) subpixel, and a white (W) subpixel. For example, as shown in FIG. 2A, the red (R) subpixel, the green (G) subpixel, and the blue (B) subpixel may be arranged in a row along the same imaginary horizontal line. Alternatively, as shown in FIG. 2B, the red (R) subpixel, the green (G) subpixel, and the blue (B) subpixel may be spaced apart from each other so as to be arranged in an imaginary triangular structure. The configuration of the unit pixel is not limited to what is illustrated in FIGS. 2A and 2B, and the unit pixel may be formed in any of various other configurations.

Figure 3:
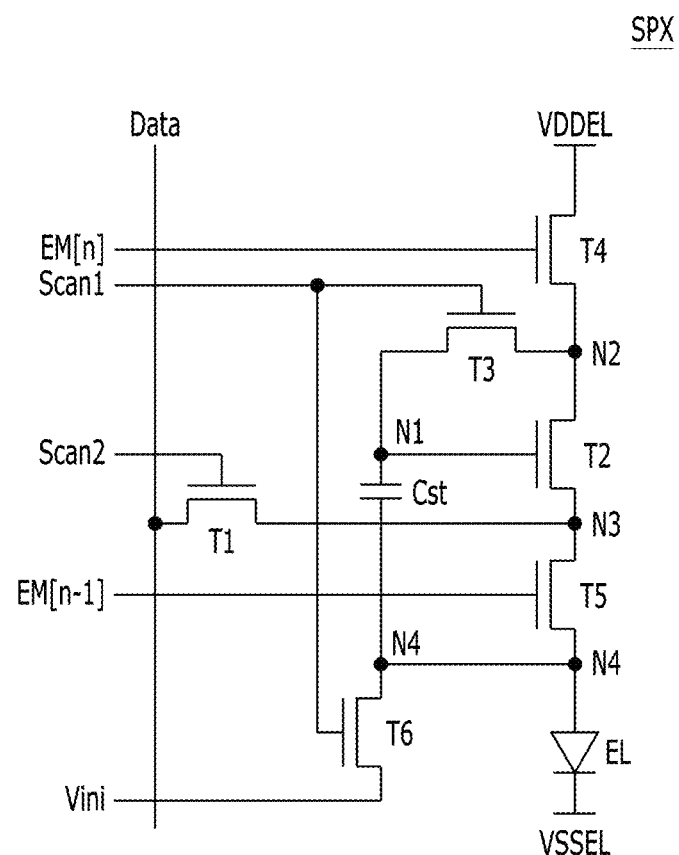
FIG. 3 is a circuit diagram showing one pixel-driving circuit in the display device according to the embodiment of the present disclosure.

FIG. 3 is a circuit diagram showing one pixel-driving circuit in the display device according to the embodiment of the present disclosure. The subpixel SPX includes a light-emitting element EL and a pixel-driving circuit, and the pixel-driving circuit includes six transistors and one capacitor to supply driving current to the light-emitting element EL. The equivalent circuit of the subpixel SPX shown in FIG. 3 is not limited thereto, and may be implemented in any of various other configurations.

Specifically, the pixel-driving circuit includes a driving transistor T2, first and third to sixth switching transistors T1 and T3 to T6, and one storage capacitor Cst.

The driving transistor T2 includes a gate node connected to a first node N1, a drain node connected to a second node N2, and a source node connected to a third node N3. The first node N1 is connected to one node of the storage capacitor Cst, the second node N2 is connected to the third switching transistor T3 and the fourth switching transistor T4, and the third node N3 is connected to the first switching transistor T1 and the fifth switching transistor T5. The source node of the driving transistor T2 is electrically connected to an organic light-emitting element. The driving transistor T2 may also be referred to as a pixel emission driving element.

Specifically, the source node of the driving transistor T2 is connected to the drain node of the fifth switching transistor T5 and the third node N3. In addition, the driving transistor T2 is electrically connected to the anode of the organic light-emitting element.

The drain node of the driving transistor T2 is connected to a high-potential voltage line, which provides a high-potential voltage VDDEL, via the fourth switching transistor T4. Accordingly, during a light-emitting period, the driving transistor T2 is turned on by receiving the high-potential voltage VDDEL through the fourth switching transistor T4, and provides driving current to the light-emitting element EL.

The first switching transistor T1 includes a gate node connected to a second scan signal line, which provides a second scan signal Scan2, a drain node connected to the data line, which provides a data signal Data, and a source node connected to the third node N3. The first switching transistor T1 is turned on or off by the second scan signal Scan2. The first switching transistor T1 is turned on and supplies a data voltage Data to the third node N3.

The third switching transistor T3 includes a gate node connected to a first scan signal line, to which a first scan signal Scan1 is provided, a drain node connected to the second node N2, and a source node connected to the first node. The third switching transistor T3 is turned on to diode-connect the gate node and the drain node of the driving transistor T2, thereby sensing the threshold voltage of the driving transistor T2.

The fourth switching transistor T4 includes a gate node connected to an $n^{th}$ emission control signal line, to which an $n^{th}$ emission control signal EM[n] is provided, a drain node connected to the high-potential voltage line, and a source node connected to the second node N2. The fourth switching transistor T4 is turned on by the $n^{th}$ emission control signal EM[n] and supplies the high-potential voltage VDDEL to the drain node of the driving transistor T2.

Since the fourth switching transistor T4 supplies the high-potential voltage VDDEL to the drain node of the driving transistor T2, the drain-source current Ids of the driving transistor T2 flows to the light-emitting element EL. Accordingly, the driving transistor T2 is capable of expressing grayscale by adjusting the amount of current that is provided to the light-emitting element EL according to the data voltage Data.

The fifth switching transistor T5 includes a gate node connected to an n-emission control signal line, to which an $n-1^{th}$ emission control signal EM[n-1] is provided, a drain node connected to the third node N3, and a source node connected to a fourth node N4. In order to sample the threshold voltage of the driving transistor T2 using the coupling effect of the storage capacitor Cst, the fifth switching transistor T5 is turned on and provides the data voltage Data of the third node N3 to the fourth node N4. In addition, while the light-emitting element EL emits light, the fifth switching transistor T5 is turned on and provides driving current to the light-emitting element EL.

The sixth switching transistor T6 includes a gate node connected to the first scan signal line, to which the first scan signal Scan1 is provided, a source node connected to an initialization voltage line, to which an initialization voltage Vini is provided, and a drain node connected to the fourth node N4.

The sixth switching transistor T6 is turned on by the first scan signal Scan1 and supplies the initialization voltage Vini to the fourth node N4, thereby discharging the anode of the light-emitting element EL.

The storage capacitor Cst is connected to the first node N1 and the fourth node N4 to store the voltage applied to the gate node of the driving transistor T2.

The storage capacitor Cst is electrically connected to the first node N1 and the fourth node N4 to store the difference between the voltage supplied to the gate node of the driving transistor T2 and the voltage supplied to the anode of the light-emitting element EL.

Hereinafter, the structure of the driving transistor T2 will be described in detail.

Figure 4:
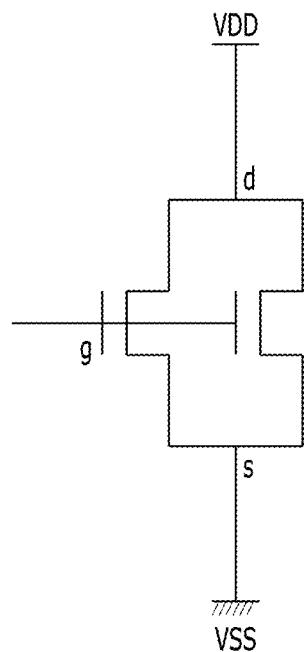
FIG. 4 is a detailed circuit diagram of the pixel emission driving element T2 of FIG. 3 according to an embodiment of the present disclosure.

FIG. 4 is a detailed circuit diagram of the pixel emission driving element T2 of FIG. 3 according to one embodiment.

According to the embodiments of the present disclosure, since the driving transistor T2 requires S-factor characteristics, which improve driving current supply performance and enable expression of low grayscale, the driving transistor T2 may be designed by connecting two transistors in parallel as shown in FIG. 4. Accordingly, it is possible to greatly improve the driving performance of the subpixel SPX.

In the embodiment of the present disclosure, although each subpixel SPX has been described with reference to FIG. 3 as including the organic light-emitting element, the first to sixth transistors T1 to T6, and the storage capacitor Cst, the embodiment is not limited thereto. For example, in the display device according to the embodiment of the present invention, each subpixel SPX may include a light-emitting element, first to sixth transistors T1 to T6, a seventh transistor and a storage capacitor Cst.

Figure 5:
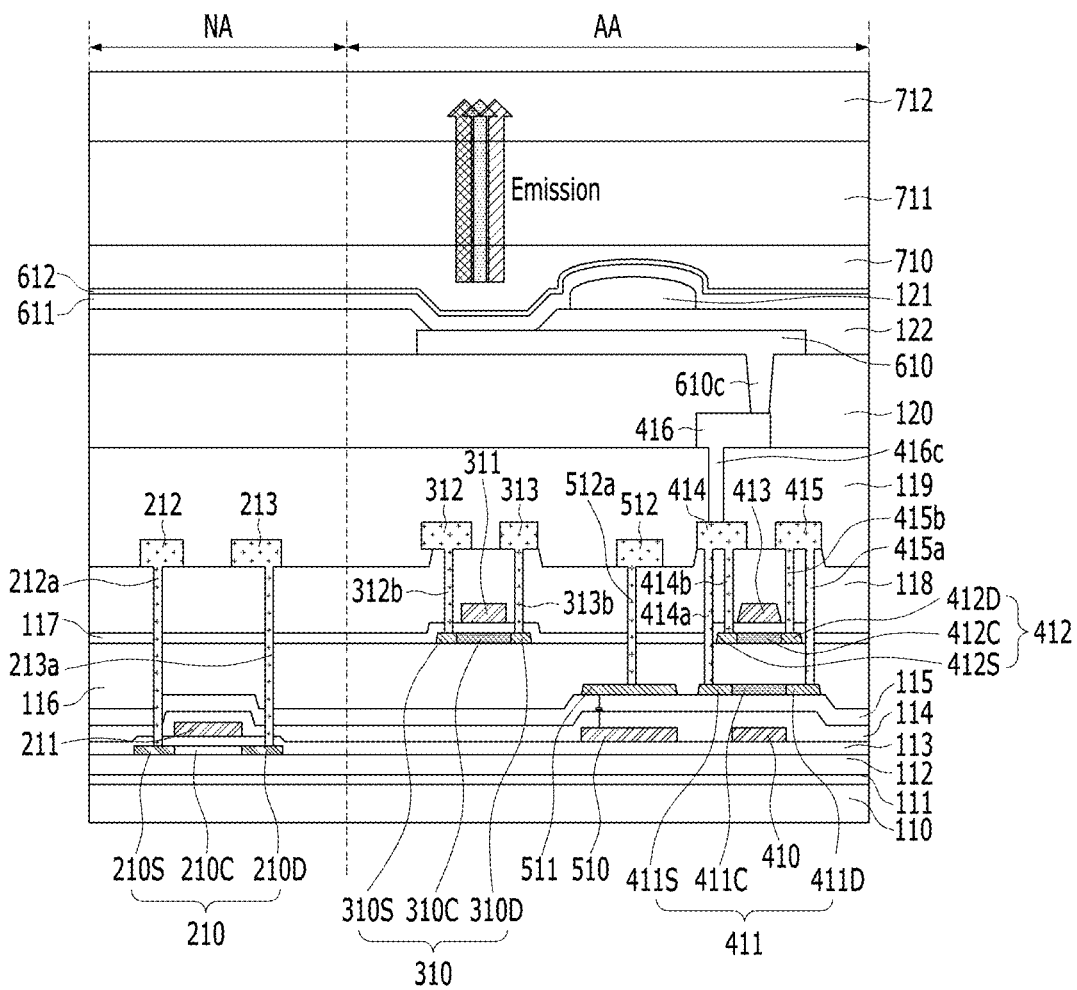
FIG. 5 is a cross-sectional view of the display device according to the embodiment of the present disclosure.
Figure 6:
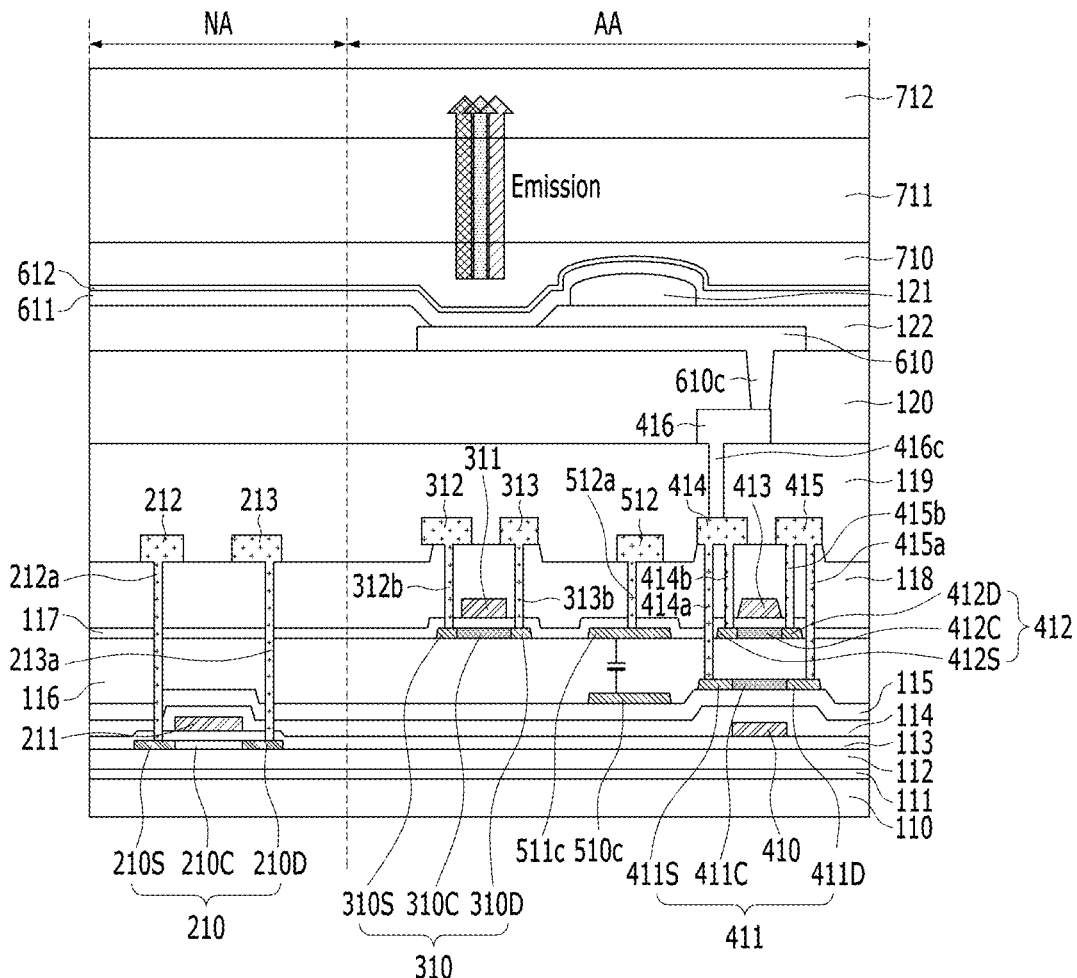
FIG. 6 is a cross-sectional view of a display device according to another embodiment of the present disclosure.
Figure 7:
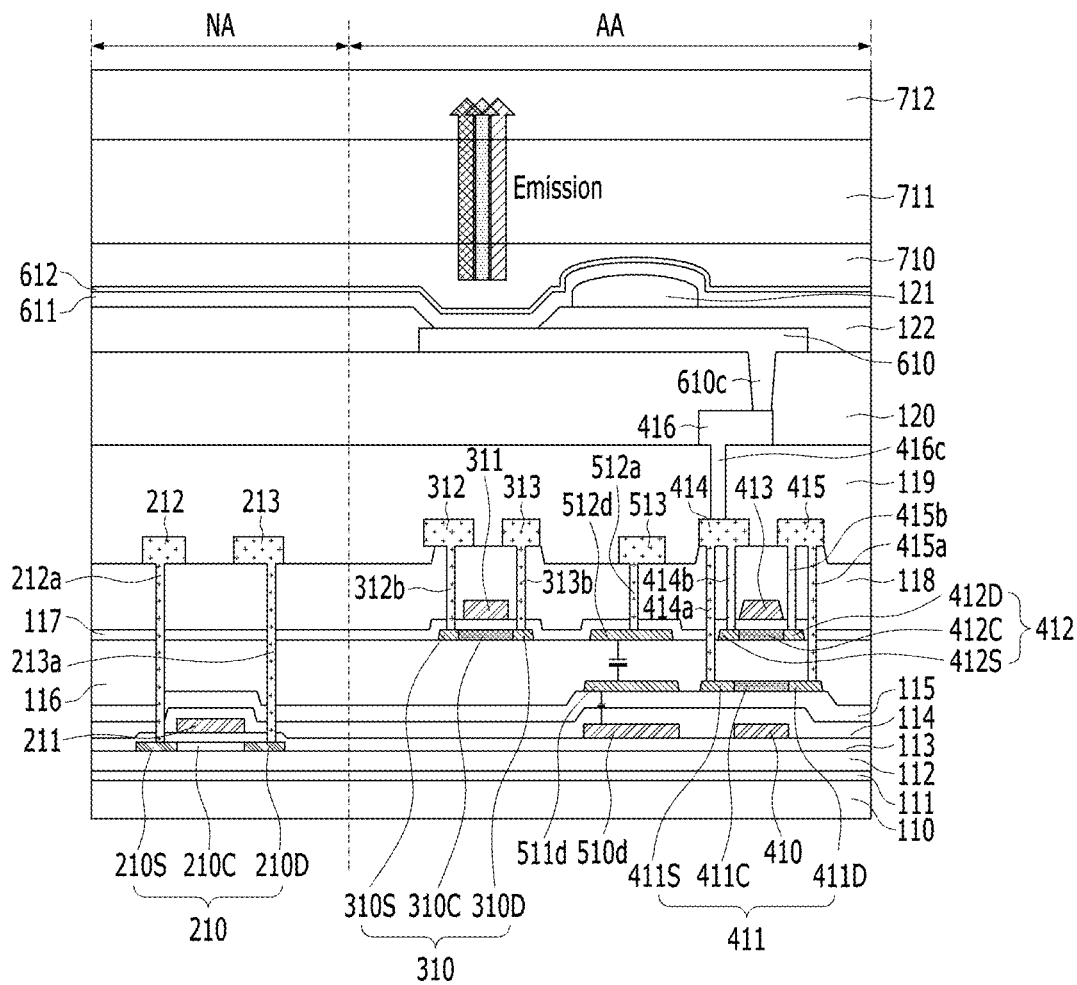
FIG. 7 is a cross-sectional view of a display device according to still another embodiment of the present disclosure.
Figure 8:
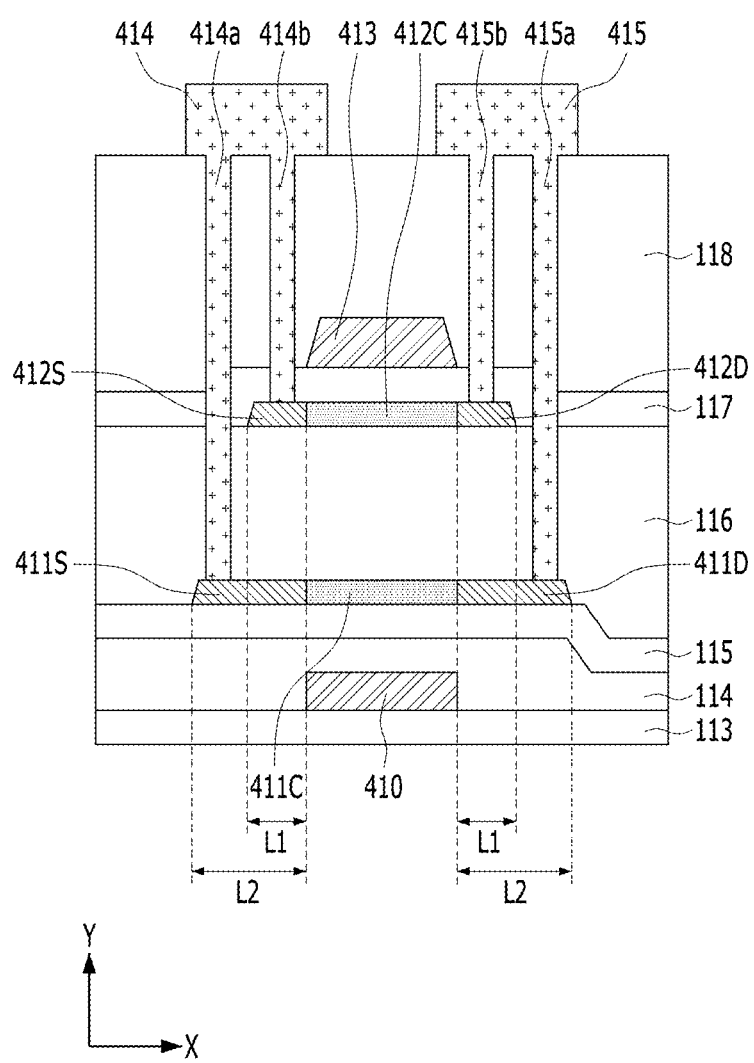
FIG. 8 is a detailed cross-sectional view of the second thin-film transistor of FIG. 5 according to an embodiment of the present disclosure.
Figure 9:
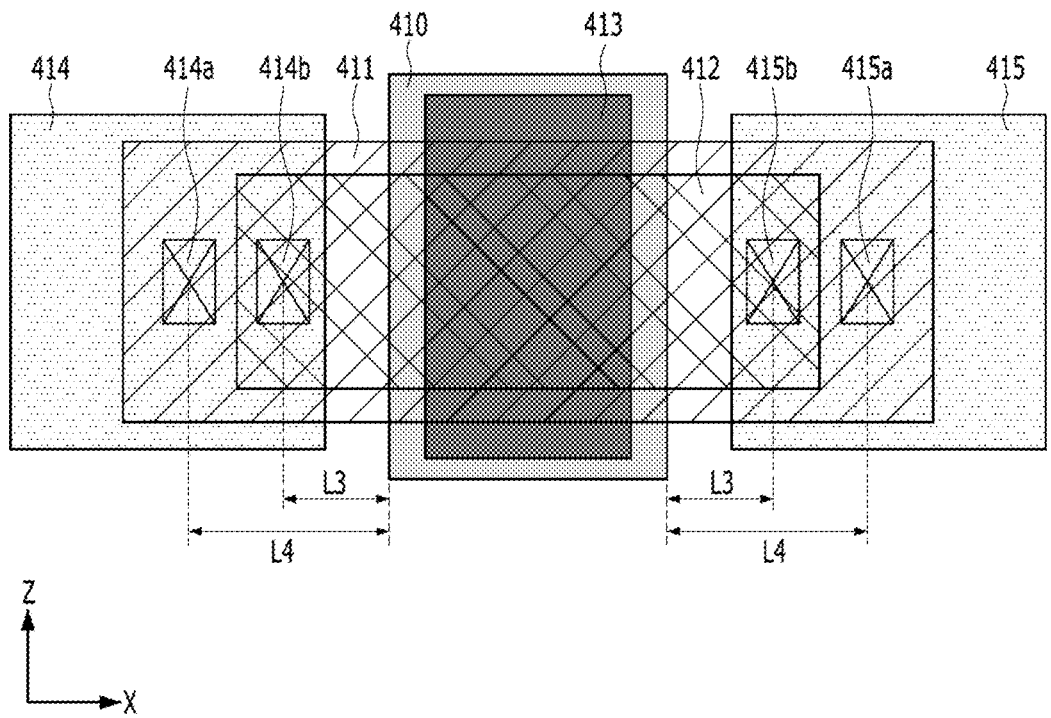
FIG. 9 is a detailed plan view of the second thin-film transistor of FIG. 5 according to an embodiment of the present disclosure.

FIG. 5 is a view showing the cross-sectional structure taken along line I-I' in FIG. 1 according to one embodiment. FIGS. 6 and 7 are views showing other embodiments of the structure of the storage capacitor Cst in the pixel-driving circuit in the display area AA. FIGS. 8 and 9 are, respectively, a cross-sectional view and a plan view showing the parallel connection structure of the pixel-driving transistor in the display area AA. The display device according to the embodiment of the present invention will now be described in detail with reference to FIGS. 5 to 9.

Referring to FIG. 5, a polycrystalline semiconductor layer 210 of a first thin-film transistor 200, which is disposed in the gate-driving unit in the non-active area NA, is formed on a lower buffer layer 112. The polycrystalline semiconductor layer 210 includes a channel region 210C, a source region 210S, and a drain region 210D. The channel region 210C overlaps a first gate electrode 211, with a first gate insulation film 113 interposed therebetween, and is formed between a first source electrode 212 and a first drain electrode 213. The source region 210S is electrically connected to the first source electrode 212 through a first source contact hole 212a. The drain region is electrically connected to the first drain electrode 213 through a first drain contact hole 213a. The polycrystalline semiconductor layer 210 has higher mobility than an amorphous semiconductor layer and oxide semiconductor layers 310, 411 and 412, thereby exhibiting low energy/power consumption and improved reliability. Therefore, the polycrystalline semiconductor layer 210 is suitable for application to the gate-driving unit 103 for driving the scan line SL. A multi-buffer layer 111 and the lower buffer layer 112 are disposed between the polycrystalline semiconductor layer 210 and the substrate 110. The multi-buffer layer 111 impedes the diffusion of moisture and/or oxygen that has permeated the substrate 110. The multi-buffer layer 111 is formed in a manner such that silicon nitride (SiNx) and silicon oxide (SiOx) are alternately stacked one on another at least once. The lower buffer layer 112 functions to protect the polycrystalline semiconductor layer 210 and to interrupt the spread of various kinds of defects from the substrate 110. The lower buffer layer 112 may be formed of a-Si, silicon nitride (SiNx), silicon oxide (SiOx), or the like.

The first gate electrode 211 is formed on the first gate insulation film 113. The first gate electrode 211 overlaps the channel region 210C of the polycrystalline semiconductor layer 210, with the first gate insulation film 113 interposed therebetween. The first gate electrode 211 may be a single layer or multiple layers formed of the same material as a lower storage electrode 510 and a second gate electrode 410, for example, one of molybdenum (Mo), aluminum (Al), chrome (Cr), gold (Au), titanium (Ti), nickel (Ni), neodymium (Nd), and copper (Cu), or an alloy thereof. However, the embodiment is not limited thereto.

A first interlayer insulation film 114, which is located on the polycrystalline semiconductor layer 210, is configured as an inorganic film that has higher hydrogen particle content than a second gate insulation film 115 and an upper buffer layer 116. For example, the first interlayer insulation film 114 is formed of silicon nitride (SiNx) through a deposition process using ammonia (NH3) gas, and the second gate insulation film 115 and the upper buffer layer 116 are formed of silicon oxide (SiOx). The hydrogen particles contained in the first interlayer insulation film 114 diffuse into the polycrystalline semiconductor layer 210 during a hydrogenation process, whereby pores in the polycrystalline semiconductor layer 210 are filled with hydrogen. Accordingly, the polycrystalline semiconductor layer 210 is stabilized, thus preventing or at least reducing deterioration in the characteristics of the first thin-film transistor 200.

The first source electrode 212 is connected to the source region 210S of the polycrystalline semiconductor layer 210 through the first source contact hole 212a that penetrates the first gate insulation film 113, the first interlayer insulation film 114, the second gate insulation film 115, the upper buffer layer 116, a third gate insulation film 117, and a second interlayer insulation film 118. The first drain electrode 213 faces the first source electrode 212 and is connected to the drain region 210D of the polycrystalline semiconductor layer 210 through the first drain contact hole 213a that penetrates the first gate insulation film 113, the first interlayer insulation film 114, the second gate insulation film 115, the upper buffer layer 116, the third gate insulation film 117, and the second interlayer insulation film 118. Since the first source electrode 212 and the first drain electrode 213 are located in the same plane and are formed of the same material as a storage supply line 512, the first source electrode 212 and the first drain electrode 213 may be formed at the same time through the same mask process as the storage supply line 512.

After the activation and hydrogenation processes of the polycrystalline semiconductor layer 210 of the first thin-film transistor 200, a first oxide semiconductor layer 411 and a second oxide semiconductor layer 412 of a second thin-film transistor 400 are formed. That is, the first oxide semiconductor layer 411 and the second oxide semiconductor layer 412 are located on the polycrystalline semiconductor layer 210. Accordingly, the first oxide semiconductor layer 411 and the second oxide semiconductor layer 412 are not exposed to the high-temperature atmosphere of the activation and hydrogenation processes of the polycrystalline semiconductor layer 210, whereby damage to the first oxide semiconductor layer 411 and the second oxide semiconductor layer 412 is prevented or at least reduced, thus improving reliability.

The second thin-film transistor 400 is disposed on the substrate 110 so as to be spaced apart from the first thin-film transistor 200. The second thin-film transistor 400 includes the second gate electrode 410, the first oxide semiconductor layer 411, the second oxide semiconductor layer 412, a third gate electrode 413, a second source electrode 414, and a second drain electrode 415.

The second gate electrode 410 overlaps the first oxide semiconductor layer 411, with the first interlayer insulation film 114 and the second gate insulation film 115 interposed therebetween. The second oxide semiconductor layer 412 is formed on the upper buffer layer 116 so as to overlap the third gate electrode 413, and the first and second oxide semiconductor layers 411 and 412 form channels between the second source electrode 414 and the second drain electrode 415. The first and second oxide semiconductor layers 411 and 412 are formed of oxide including at least one metal selected from the group consisting of Zn, Cd, Ga, In, Sn, Hf, and Zr.

The second interlayer insulation film 118, the third gate insulation film 117, the upper buffer layer 116, and the second gate insulation film 115 are configured as inorganic films that have lower hydrogen particle content than the first interlayer insulation film 114. For example, the second interlayer insulation film 118, the third gate insulation film 117, the upper buffer layer 116, and the second gate insulation film 115 are formed of silicon oxide (SiOx), and the first interlayer insulation film 114 is formed of silicon nitride (SiNx). Accordingly, when a heat treatment process is performed on the first and second oxide semiconductor layers 411 and 412, it is possible to prevent or at least reduce hydrogen contained in the first interlayer insulation film 114 and hydrogen contained in the polycrystalline semiconductor layer 210 from diffusing to the first and second oxide semiconductor layers 411 and 412.

Each of the second source electrode 414 and the second drain electrode 415 may be a single layer or multiple layers located on the second interlayer insulation film 118, and may be formed of one of molybdenum (Mo), aluminum (Al), chrome (Cr), gold (Au), titanium (Ti), nickel (Ni), neodymium (Nd), and copper (Cu), or an alloy thereof. However, the embodiment is not limited thereto.

The second source electrode 414 is connected to a source region 412S of the second oxide semiconductor layer 412 through a second source contact hole 414b that penetrates the second interlayer insulation film 118 and the third gate insulation film 117, and the second drain electrode 415 is connected to a drain region 412D of the second oxide semiconductor layer 412 through a second drain contact hole 415b that penetrates the second interlayer insulation film 118 and the third gate insulation film 117. In addition, for the connection between the first oxide semiconductor layer 411 and the second oxide semiconductor layer 412, the second source electrode 414 is connected to a source region 411S of the first oxide semiconductor layer 411 through a second source contact hole 414a that penetrates the second interlayer insulation film 118, the third gate insulation film 117, and the upper buffer layer 116, and the second drain electrode 415 is connected to a drain region 411D of the first oxide semiconductor layer 411 through a second drain contact hole 415a that penetrates the second interlayer insulation film 118, the third gate insulation film 117, and the upper buffer layer 116. In addition, the second source electrode 414 and the second drain electrode 415 are formed so as to face each other, with channel regions 411C and 412C of the first and second oxide semiconductor layers 411 and 412 interposed therebetween.

Since the second thin-film transistor 400, in which the first and second oxide semiconductor layers 411 and 412 are connected to each other and which includes the second gate electrode 410, the third gate electrode 413, the second source electrode 414, and the second drain electrode 415, has advantages in that the amount of driving current thereof is greater than that of a third thin-film transistor 300 and in that the ratio of variation in current to variation in voltage is not large, it is suitable for application to the pixel-driving transistor T2.

The third thin-film transistor 300 is disposed on the substrate 110 so as to be spaced apart from the first thin-film transistor 200. The third thin-film transistor 300 includes a fourth gate electrode 311, a third oxide semiconductor layer 310, a third source electrode 312, and a third drain electrode 313.

The fourth gate electrode 311 overlaps the third oxide semiconductor layer 310, with the third gate insulation film 117 interposed therebetween. The third oxide semiconductor layer 310 is formed on the upper buffer layer 116 so as to overlap the fourth gate electrode 311, and the third oxide semiconductor layer 310 forms a channel between the third source electrode 312 and the third drain electrode 313. The third oxide semiconductor layer 310 is formed of oxide including at least one metal selected from the group consisting of Zn, Cd, Ga, In, Sn, Hf, and Zr. The third oxide semiconductor layer 310 may be formed of the same material and through the same process as the second oxide semiconductor layer 412.

Since the second interlayer insulation film 118, the third gate insulation film 117, the upper buffer layer 116, and the second gate insulation film 115 of the third thin-film transistor 300 have the same configurations and functions of those of the second thin-film transistor, a detailed description thereof will be omitted.

Each of the third source electrode 312 and the third drain electrode 313 may be a single layer or multiple layers located on the second interlayer insulation film 118, and may be formed of one of molybdenum (Mo), aluminum (Al), chrome (Cr), gold (Au), titanium (Ti), nickel (Ni), neodymium (Nd), and copper (Cu), or an alloy thereof. However, the embodiment is not limited thereto.

The third source electrode 312 is connected to a source region 310S of the third oxide semiconductor layer 310 through a third source contact hole 312b that penetrates the second interlayer insulation film 118 and the third gate insulation film 117, and the third drain electrode 313 is connected to a drain region 310D of the third oxide semiconductor layer 310 through a third drain contact hole 313b that penetrates the second interlayer insulation film 118 and the third gate insulation film 117. The third source electrode 312 and the third drain electrode 313 are formed so as to face each other, with a channel region 310C of the third oxide semiconductor layer 310 interposed therebetween.

The source regions 411S, 412S and 310S of the first, second, and third oxide semiconductor layers 411, 412 and 310 and the drain regions 411D, 412D and 310D of the first, second, and third oxide semiconductor layers 411, 412 and 310 may be formed in the same doping process, and the dopant used in the doping process may include at least one of boron (B), phosphorus (P), fluorine (F), or hydrogen (H).

In addition, the first source and first drain contact holes 212a and 213a, which connect the polycrystalline semiconductor layer 210 to the first source and first drain electrodes 212 and 213, and the second source and second drain contact holes 414a and 415a, which connect the first oxide semiconductor layer 411 to the second source and second drain electrodes 414 and 415, are formed in the same process. In addition, the second source and second drain contact holes 414b and 415b, which connect the second oxide semiconductor layer 412 to the second source and second drain electrodes 414 and 415, and the third source and third drain contact holes 312b and 313b, which connect the third oxide semiconductor layer 310 to the third source and third drain electrodes 312 and 313, are formed in the same process.

Since the third thin-film transistor 300, which includes the third oxide semiconductor layer 310, the fourth gate electrode 311, the third source electrode 312, and the third drain electrode 313, is characterized by lower leakage current than the first thin-film transistor 200, it is suitable for application to the pixel-switching TFT, in which an On-time period is short but an Off-time period is long.

The lower storage electrode 510 is connected to any one of the third gate electrode 413 and the second source electrode 414 of the second thin-film transistor 400. The lower storage electrode 510 is located on the first gate insulation film 113, and is formed of the same material and in the same layer as the first gate electrode 211.

An upper storage electrode 511 is connected to the remaining one of the third gate electrode 413 and the second source electrode 414 of the second thin-film transistor 400 through the storage supply line 512. The upper storage electrode 511 is located on the first interlayer insulation film 114 and the second gate insulation film 115. The upper storage electrode 511 may be formed of the same material and in the same layer as the first oxide semiconductor layer 411, and may also be conductorized in the process of conductorizing the source region 411S and the drain region 411D of the first oxide semiconductor layer 411. The upper storage electrode 511 is exposed through the storage contact hole 512a that penetrates the upper buffer layer 116, the third gate insulation film 117, and the second interlayer insulation film 118 and is connected to the storage supply line 512.

A light-emitting element 600 includes an anode 610, which is connected to the second source electrode 414, at least one light-emitting stack 611, which is formed on the anode 610, and a cathode 612, which is formed on the light-emitting stack 611.

The anode 610 is connected to a pixel connection electrode 416, which is exposed through a second pixel contact hole 610c that penetrates a second planarization layer 120. The pixel connection electrode 416 is connected to the second source electrode 414, which is exposed through a first pixel contact hole 416c that penetrates a first planarization layer 119.

The anode 610 is formed in a multi-layer structure including a transparent conductive film and an opaque conductive film having high reflection efficiency. The transparent conductive film is formed of a material having a relatively high work function, e.g. indium-tin-oxide (ITO) or indium-zinc-oxide (IZO), and the opaque conductive film is formed in a single-layer or multi-layer structure including one of Al, Ag, Cu, Pb, Mo, and Ti, or an alloy thereof. For example, the anode 610 may be formed in a structure such that a transparent conductive film, an opaque conductive film and a transparent conductive film are sequentially stacked, or such that a transparent conductive film and an opaque conductive film are sequentially stacked. The anode 610 is disposed on the second planarization layer 120 so as to overlap not only the light emission region provided by a bank 122 but also the circuit region in which the first, second, and third thin-film transistors 200, 400 and 300 and the storage capacitor 500 are disposed, whereby the size of the light emission area is increased.

The light-emitting stack 611 of the light-emitting element 600 is formed by stacking, on the anode 610, a hole-related layer, an organic emission layer, and an electron-related layer, either in that order or in the reverse order. In addition, the light-emitting stack 611 may include first and second light-emitting stacks, which face each other, with a charge generation layer interposed therebetween. In this case, an organic emission layer of any one of the first and second light-emitting stacks generates blue light, and an organic emission layer of the remaining one of the first and second light-emitting stacks generates yellow-green light, with the result that white light is generated through the first and second light-emitting stacks. Since the white light generated from the light-emitting stack 611 is introduced into a color filter (not shown) disposed on the light-emitting stack 611, a color image may be realized. Alternatively, it may be possible to realize a color image in a manner such that each light-emitting stack 611 generates colored light for a corresponding subpixel without a separate color filter. That is, a light-emitting stack 611 of a red (R) subpixel may generate red light, a light-emitting stack 611 of a green (G) subpixel may generate green light, and a light-emitting stack 611 of a blue (B) subpixel may generate blue light.

The bank 122 may be formed so as to expose the anode 610 of each subpixel. The bank 122 may be formed of an opaque material (e.g. a black material) in order to prevent or at least reduce optical interference between neighboring subpixels. In this case, the bank 122 is formed of a light-blocking material including at least one of a color pigment, organic black, or carbon. A spacer 121 may be further disposed on the bank 122.

The cathode 612 is formed on the upper surface and the side surfaces of the light-emitting stack 611 so as to face the anode 610, with the light-emitting stack 611 interposed therebetween. In the case in which the cathode 612 is applied to a top-emission-type organic light-emitting display device, the cathode 612 is configured as a transparent conductive film formed of, for example, indium-tin-oxide (ITO) or indium-zinc-oxide (IZO). An encapsulation unit 700 for preventing the permeation of moisture may be further disposed on the cathode 612 of the light-emitting element 600.

The encapsulation unit 700 may include a first inorganic encapsulation layer 710, a second organic encapsulation layer 711, and a third inorganic encapsulation layer 712. The first inorganic encapsulation layer 710 of the encapsulation unit 700 may be disposed on the cathode 612. The second organic encapsulation layer 711 may be disposed on the first inorganic encapsulation layer 710. The third inorganic encapsulation layer 712 may be disposed on the second organic encapsulation layer 711. The first inorganic encapsulation layer 710 and the third inorganic encapsulation layer 712 of the encapsulation unit 700 may be formed of an inorganic material such as silicon nitride (SiNx) or silicon oxide (SiOx). The second organic encapsulation layer 711 of the encapsulation unit 700 may be formed of an organic material such as acrylic resin, epoxy resin, phenolic resin, polyamide resin, or polyimide resin.

FIGS. 6 and 7 are cross-sectional views showing display devices according to other embodiments of the present disclosure. The following description will focus on differences from the embodiment shown in FIG. 5, and a description redundant with the contents described above will be omitted or made briefly. For example, a substrate 110, a multi-buffer layer 111, a lower buffer layer 112, a first gate insulation film 113, a first interlayer insulation film 114, a second gate insulation film 115, an upper buffer layer 116, a third gate insulation film 117, a second interlayer insulation film 118, a first planarization layer 119, a second planarization layer 120, a bank 122, a spacer 121, first, second, and third thin-film transistors 200, 400 and 300, a light-emitting element 600, and an encapsulation unit 700 are substantially the same as those described above. Therefore, the configurations of FIGS. 6 and 7 that are substantially the same as those of FIG. 5 will be omitted or described briefly.

FIG. 6 is a view showing another embodiment of the structure of the storage capacitor of the display device 100 according to the embodiment of the present disclosure. A substrate 110, a multi-buffer layer 111, a lower buffer layer 112, a first gate insulation film 113, a first interlayer insulation film 114, a second gate insulation film 115, an upper buffer layer 116, a third gate insulation film 117, a second interlayer insulation film 118, a first planarization layer 119, a second planarization layer 120, a bank 122, a spacer 121, first, second, and third thin-film transistors 200, 400 and 300, a light-emitting element 600, and an encapsulation unit 700 are substantially the same as those shown in FIG. 5.

A lower storage electrode 510*c* is connected to any one of a third gate electrode 413 and a second source electrode 414 of the second thin-film transistor 400. The lower storage electrode 510*c* is located on the second gate insulation film 115, is formed of the same material and in the same layer as a first oxide semiconductor layer 411, and is also conductorized in the process of conductorizing a source region 411S and a drain region 411D of the first oxide semiconductor layer 411.

An upper storage electrode 511*c* is connected to the remaining one of the third gate electrode 413 and the second source electrode 414 of the second thin-film transistor 400 through a storage supply line 512. The upper storage electrode 511*c* is located on the upper buffer layer 116. The upper storage electrode 511*c* is formed of the same material and in the same layer as a second oxide semiconductor layer 412, and is also conductorized in the process of conductorizing a source region 412S and a drain region 412D of the second oxide semiconductor layer 412. The upper storage electrode 511*c* is exposed through a storage contact hole 512*a* that penetrates the third gate insulation film 117 and the second interlayer insulation film 118, and is connected to the storage supply line 512.

FIG. 7 is a view showing still another embodiment of the structure of the storage capacitor of the display device 100 according to the embodiment of the present disclosure. A substrate 110, a multi-buffer layer 111, a lower buffer layer 112, a first gate insulation film 113, a first interlayer insulation film 114, a second gate insulation film 115, an upper buffer layer 116, a third gate insulation film 117, a second interlayer insulation film 118, a first planarization layer 119, a second planarization layer 120, a bank 122, a spacer 121, first, second, and third thin-film transistors 200, 400 and 300, a light-emitting element 600, and an encapsulation unit 700 are substantially the same as those shown in FIG. 5.

A lower storage electrode 510d is connected to any one of a third gate electrode 413 and a second source electrode 414 of the second thin-film transistor 400. The lower storage electrode 510d is located on the first gate insulation film 113, and is formed of the same material and in the same layer as a first gate electrode 211 and a second gate electrode 410.

An intermediate storage electrode 511d is connected to any one of the third gate electrode 413 and the second source electrode 414 of the second thin-film transistor 400. The intermediate storage electrode 511d is located on the second gate insulation film 115, is formed of the same material and in the same layer as a first oxide semiconductor layer 411, and is also conductorized in the process of conductorizing a source region 411S and a drain region 411D of the first oxide semiconductor layer 411.

An upper storage electrode 512d is connected to the remaining one of the third gate electrode 413 and the second source electrode 414 of the second thin-film transistor 400 through a storage supply line 513. The upper storage electrode 512d is located on the upper buffer layer 116. The upper storage electrode 512d is formed of the same material and in the same layer as a second oxide semiconductor layer 412, and is also conductorized in the process of conductorizing a source region 412S and a drain region 412D of the second oxide semiconductor layer 412. The upper storage electrode 512d is exposed through a storage contact hole 512a that penetrates the third gate insulation film 117 and the second interlayer insulation film 118, and is connected to the storage supply line 513.

The parallel connection structure of the storage capacitor Cst shown in FIG. 7 has an advantage of exhibiting larger storage capacity than the structures of the storage capacitors Cst shown in FIGS. 5 and 6.

FIG. 8 is a detailed cross-sectional view of the second thin-film transistor 400 of FIG. 5 according to one embodiment. The second thin-film transistor 400 includes a second gate electrode 410, a first oxide semiconductor layer 411, a second oxide semiconductor layer 412, a third gate electrode 413, a second source electrode 414, and a second drain electrode 415.

The second gate electrode 410 overlaps the first oxide semiconductor layer 411, with a first interlayer insulation film 114 and a second gate insulation film 115 interposed therebetween. The second oxide semiconductor layer 412 is formed on an upper buffer layer 116 so as to overlap the third gate electrode 413, and the first and second oxide semiconductor layers 411 and 412 form channels between the second source electrode 414 and the second drain electrode 415.

The first oxide semiconductor layer 411 includes a first source region 411S, a first drain region 411D, and a first channel region 411C. In addition, the second oxide semiconductor layer 412 includes a second source region 412S, a second drain region 412D, and a second channel region 412C.

The first source and drain regions 411S and 411D and the second source and drain regions 412S and 412D include regions that are conductorized through a doping process. When the length of each of the conductorized first source and drain regions 411S and 411D in the X direction is denoted by L2 and the length of each of the conductorized second source and drain regions 412S and 412D in the X direction is denoted by L1, L2 may be set to be greater than L1.

FIG. 9 is a plan view of the second thin-film transistor 400 of FIG. 8 according to one embodiment. The second thin-film transistor 400 includes the second gate electrode 410, the first oxide semiconductor layer 411, the second oxide semiconductor layer 412, the third gate electrode 413, the second source electrode 414, and the second drain electrode 415.

The second gate electrode 410 is formed so as to overlap the first oxide semiconductor layer 411, and the second oxide semiconductor layer 412 is formed so as to overlap the third gate electrode 413. The first and second oxide semiconductor layers 411 and 412 are connected to the second source and second drain electrodes 414 and 415.

The second source electrode 414 is connected to the second oxide semiconductor layer 412 through a second source contact hole 414b, and the second drain electrode 415 is connected to the second oxide semiconductor layer 412 through a second drain contact hole 415b. In addition, for the connection between the first oxide semiconductor layer 411 and the second oxide semiconductor layer 412, the second source electrode 414 is connected to the first oxide semiconductor layer 411 through a second source contact hole 414a, and the second drain electrode 415 is connected to the first oxide semiconductor layer 411 through a second drain contact hole 415a.

The second source electrode 414 and the second drain electrode 415 include contact holes 414a and 415a connected to the first oxide semiconductor layer 411 and contact holes 414b and 415b connected to the second oxide semiconductor layer 412.

When the spacing distance from each of the contact holes 414a and 415a, which are connected to the first oxide semiconductor layer 411, to the third gate electrode 413 in the X direction is denoted by L4 and the spacing distance from each of the contact holes 414b and 415b, which are connected to the second oxide semiconductor layer 412, to the third gate electrode 413 in the X direction is denoted by L3, L4 may be set to be greater than L3.

FIGS. 10 and 11A-11C show the results of a simulation performed to test the embodiment of the present disclosure.

Figure 10:
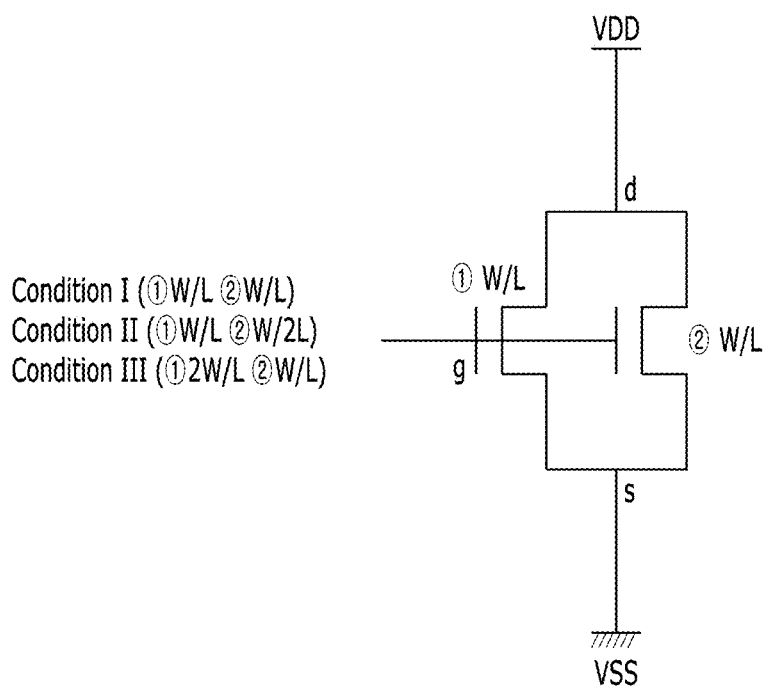
FIG. 10 is a circuit diagram of a pixel emission driving element according to the present disclosure that has undergone simulation.

FIG. 10 is a circuit diagram of the light-emitting pixel driving transistor according to the embodiment of the present disclosure. The light-emitting pixel driving transistor is configured such that dual transistors are connected in parallel. For the simulation, dual transistors satisfying condition I, condition II, and condition III were provided. Here, condition I, condition II, and condition III were set to have different respective combinations of values of "width/length" (W/L) of channels of the dual transistors, which are connected in parallel such that an upper transistor (①) and a lower transistor (②) overlap each other.

Figure 11A:
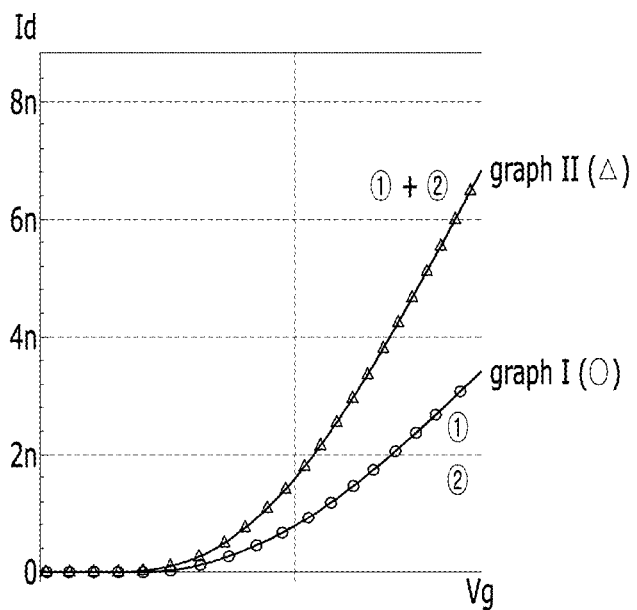
FIG. 11A is a graph indicating an I-V curve obtained by simulation performed under condition I of FIG. 10.

FIG. 11A shows the simulation result, i.e. the characteristics (I-V curve) of the light-emitting pixel driving transistor having the dual parallel structure of FIG. 10, which satisfies condition I (①W/L ②W/L).

Referring to FIG. 11A, the light-emitting pixel driving transistor composed of only a single transistor (①W/L or ②W/L) yields the result indicated by graph I (○) and the light-emitting pixel driving transistor composed of dual transistors connected in parallel (①W/L+②W/L) yields the result indicated by graph II (Δ). It can be seen from graph I (○) and graph II (Δ) that the driving current Id of the light-emitting pixel driving transistor composed of dual transistors connected in parallel (graph II (Δ)) is higher than that of the light-emitting pixel driving transistor composed of a single transistor (graph I (○)).

Figure 11B:
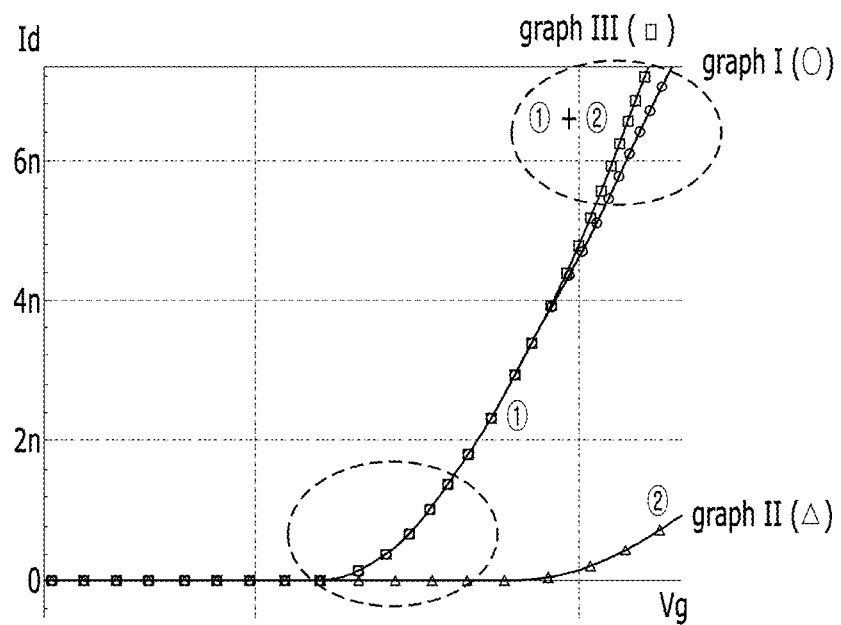
FIG. 11B is a graph indicating an I-V curve obtained by simulation performed under condition II of FIG. 10.

FIG. 11B shows the simulation result, i.e. the characteristics (I-V curve) of the light-emitting pixel driving transistor having the dual parallel structure of FIG. 10, which satisfies condition II (①W/L ②W/2L).

Referring to FIG. 11B, the light-emitting pixel driving transistor composed of a single transistor (①W/L) yields the result indicated by graph I (o), and the light-emitting pixel driving transistor composed of another single transistor (②W/2L) yields the result indicated by graph II (Δ). The light-emitting pixel driving transistor composed of dual transistors connected in parallel (①W/L+②W/2L) yields the result indicated by graph III (□). It can be seen from graph I (o), graph II (Δ), and graph III (□) that the driving current Id of the light-emitting pixel driving transistor composed of dual transistors connected in parallel (graph III (□)) is higher than that of the light-emitting pixel driving transistor composed of a single transistor (graph I (o) or graph II (Δ)).

Figure 11C:
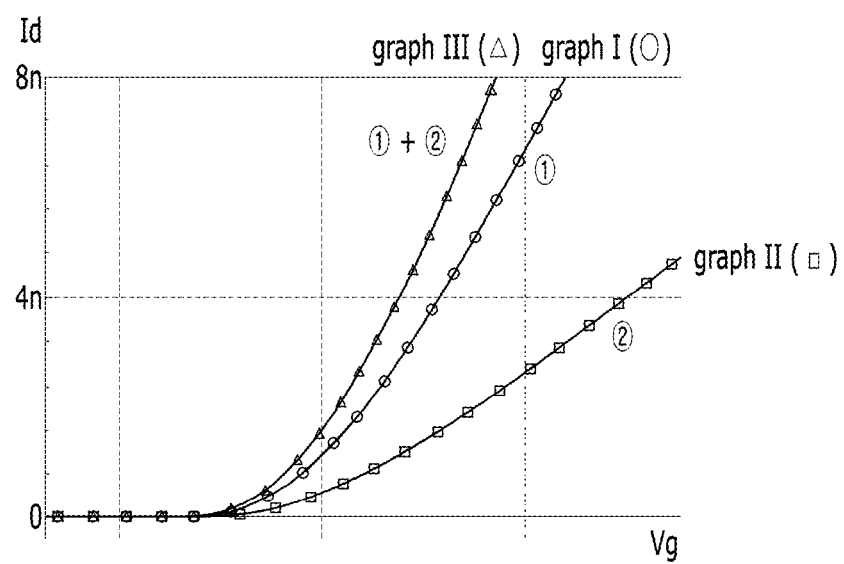
FIG. 11C is a graph indicating an I-V curve obtained by simulation performed under condition III of FIG. 10.

FIG. 11C shows the simulation result, i.e. the characteristics (I-V curve) of the light-emitting pixel driving transistor having the dual parallel structure of FIG. 10, which satisfies condition III (①2W/L ②W/L).

Referring to FIG. 11C, the light-emitting pixel driving transistor composed of a single transistor (①2W/L) yields the result indicated by graph I (⊚), and the light-emitting pixel driving transistor composed of another single transistor (②W/L) yields the result indicated by graph II (□). The light-emitting pixel driving transistor composed of dual transistors connected in parallel (①2W/L+②W/L) yields the result indicated by graph III (Δ). It can be seen from graph I (⊚), graph II (□), and graph III (Δ) that the driving current Id of the light-emitting pixel driving transistor composed of dual transistors connected in parallel (graph III (Δ)) is higher than that of the light-emitting pixel driving transistor composed of a single transistor (graph I (⊚) or graph II (□)).

The display device according to the embodiment of the present invention includes a liquid crystal display (LCD) device, a field emission display (FED) device, an organic light-emitting display (OLED) device, and a quantum dot display device.

The display device according to the embodiment of the present disclosure may also include a set device (or a set apparatus) or a set electronic apparatus, such as a laptop computer, a television, a computer monitor, an equipment apparatus including an automotive display or another type of vehicular apparatus, or a mobile electronic apparatus such as a smartphone or an electronic pad, which is a complete product (or a final product) including a liquid crystal module (LCM) or an OLED module.

The display device according to the embodiment of the present disclosure may be explained as follows.

The display device according to the embodiment of the present disclosure includes a substrate including a display area and a non-display area, a first thin-film transistor located in the non-display area, and second and third thin-film transistors located in the display area. The first thin-film transistor may include a first semiconductor pattern including a first poly silicon, a first gate electrode overlapping the first semiconductor pattern, and first source and first drain electrodes connected to the first semiconductor pattern.

The third thin-film transistor may include a fourth semiconductor pattern including a first oxide semiconductor, a fourth gate electrode overlapping the fourth semiconductor pattern, and third source and third drain electrodes connected to the fourth semiconductor pattern.

The second thin-film transistor may include second and third semiconductor patterns including a first oxide semiconductor, a third gate electrode overlapping the third semiconductor pattern, a second gate electrode overlapping the second semiconductor pattern, and second source and second drain electrodes connected to the second and third semiconductor patterns through a contact hole.

The third semiconductor pattern and the second semiconductor pattern may be connected in parallel through the second source electrode and the second drain electrode.

The third semiconductor pattern and the second semiconductor pattern may overlap each other.

The third semiconductor pattern may include a third source region and a third drain region, with which the second source electrode and the second drain electrode are in contact, and the second semiconductor pattern may include a second source region and a second drain region, with which the second source electrode and the second drain electrode are in contact.

Each of the third source region, the third drain region, the second source region, and the second drain region may be doped using a dopant and may include a conductorized region.

When a length of the conductorized region of the third semiconductor pattern is denoted by L1 and a length of the conductorized region of the fourth semiconductor pattern is denoted by L2, the length of L2 in a channel direction may be set to be greater than the length of L1 in the channel direction.

The dopant may include at least one of boron (B), phosphorus (P), fluorine (F), or hydrogen (H).

The value of driving current (a saturation region in an Ids-Vgs curve) of the second thin-film transistor may be greater than the value of driving current of the third thin-film transistor.

The value (an S-factor) of the ratio of variation in current to variation in voltage of the second thin-film transistor may be greater than the S-factor of the third thin-film transistor.

A display device according to another embodiment of the present invention may include a substrate including a display area and a non-display area, a driving circuit unit located in the non-display area, and a pixel unit located in the display area. The pixel unit may include a switching transistor and a driving transistor configured to have different respective structures.

The driving transistor may include a first active layer including source/drain regions and a channel region, a second active layer located above the first active layer, source/drain electrodes located above the second active layer and connected to the source/drain regions of the first active layer and the source/drain regions of the second active layer, a lower gate electrode located below the first active layer, and an upper gate electrode located above the second active layer. The source/drain regions of the first active layer may be connected to the source/drain electrodes through a first contact hole, the source/drain regions of the second active layer may be connected to the source/drain electrodes through a second contact hole, and the first contact hole may be located farther away from the upper gate electrode than the second contact hole.

As is apparent from the above description, according to the embodiment of the present disclosure, a single-active-layer top-gate type thin-film transistor and a dual-active-layer double-gate type thin-film transistor, which have different respective electrical characteristics, are used for different purposes suitable for the characteristics thereof, whereby the performance of the display device is improved.

Specifically, since the single-active-layer top-gate type thin-film transistor and the dual-active-layer double-gate type thin-film transistor have different respective characteristics, any one thereof may be used as a switching transistor, and the other one thereof may be used as a driving transistor according to the respective characteristics thereof.

However, the effects achievable through the invention are not limited to the above-mentioned effects, and other effects not mentioned herein will be clearly understood by those skilled in the art from the above description.

It will be appreciated that the technical spirit of the present invention has been described herein only for purposes of illustration through the above description and the accompanying drawings, and that combination, separation, substitution, and modifications of components may be made by those skilled in the art without departing from the scope and spirit of the present invention. Therefore, the exemplary embodiments of the present invention are provided for illustrative purposes only and are not intended to limit the technical spirit of the present invention. The scope of the technical spirit of the present invention is not limited thereto. The protection scope of the present invention should be interpreted based on the appended claims, and it should be appreciated that all technical spirits falling within a range equivalent to the claims are included in the protection scope of the present invention.

What is claimed is:

1. A display device comprising:
   a substrate comprising a display area and a non-display area;
   a first thin-film transistor located in the non-display area; and
   a second thin-film transistor and a third thin-film transistor located in the display area,
   wherein the first thin-film transistor comprises:
      a first semiconductor pattern comprising a first poly silicon;
      a first gate electrode overlapping the first semiconductor pattern; and
      a first source electrode and a first drain electrode connected to the first semiconductor pattern,
   wherein the second thin-film transistor comprises:
      a second semiconductor pattern and a third semiconductor pattern comprising a first oxide semiconductor;
      a second gate electrode overlapping the second semiconductor pattern;
      a third gate electrode overlapping the third semiconductor pattern;
      a second source electrode and a second drain electrode connected to the second semiconductor pattern and the third semiconductor pattern through a contact hole;
      a first insulation film provided between the second semiconductor pattern and the second gate electrode; and
      a second insulation film provided between the second semiconductor pattern and the first insulation film, wherein the first insulation film has a higher hydrogen particle content than the second insulation film, and
   wherein the third thin-film transistor comprises:
      a fourth semiconductor pattern comprising a first oxide semiconductor;
      a fourth gate electrode overlapping the fourth semiconductor pattern; and
      a third source electrode and a third drain electrode connected to the fourth semiconductor pattern.

2. The display device according to claim 1, wherein the second semiconductor pattern and the third semiconductor pattern are connected in parallel through the second source electrode and the second drain electrode.

3. The display device according to claim 1, wherein the second semiconductor pattern and the third semiconductor pattern overlap each other.

4. The display device according to claim 3, wherein the second semiconductor pattern comprises a second source region and a second drain region, the second source electrode and the second drain electrode in contact with the second source region and the second drain region, and
   wherein the third semiconductor pattern comprises a third source region and a third drain region, the second source electrode and the second drain electrode in contact with the third source region and the third drain region.

5. The display device according to claim 4, wherein each of the second source region, the second drain region, the third source region, and the third drain region is doped using a dopant and includes a conductorized region.

6. The display device according to claim 5, wherein, when the conductorized region of the second semiconductor pattern is denoted by L1 and the conductorized region of the third semiconductor pattern is denoted by L2, a length of L1 in a channel direction is set to be greater than a length of L2 in the channel direction.

7. The display device according to claim 5, wherein the dopant comprises at least one of boron (B), phosphorus (P), fluorine (F), or hydrogen (H).

8. The display device according to claim 1, wherein a value of driving current of the second thin-film transistor is greater than a value of driving current of the third thin-film transistor, the value of the driving region corresponding to a saturation region in an Ids-Vgs curve.

9. The display device according to claim 1, wherein a value of a ratio of variation in current to variation in voltage of the second thin-film transistor is greater than an S-factor of the third thin-film transistor, where the value is a S-factor.

10. A display device comprising:
    a substrate comprising a display area and a non-display area;
    a driving circuit unit located in the non-display area; and
    a pixel unit located in the display area,
    wherein the pixel unit comprises a switching transistor and a driving transistor configured to have different respective structures,
    wherein the driving transistor comprises:
    a first active layer comprising source and drain regions and a channel region;
    a second active layer located above the first active layer;
    source and drain electrodes located above the second active layer, the source and drain electrodes being connected to the source and drain regions of the first active layer and source and drain regions of the second active layer;
    a lower gate electrode located below the first active layer; and
    an upper gate electrode located above the second active layer,
    wherein the source and drain regions of the first active layer are connected to the source and drain electrodes through a first contact hole, wherein the source and drain regions of the second active layer are connected to the source and drain electrodes through a second contact hole, and wherein the first contact hole is located farther away from the upper gate electrode than the second contact hole.

11. The display device according to claim 10, wherein the driving transistor is configured such that the first active layer and the second active layer are connected in parallel through the source and drain electrodes.

12. The display device according to claim 10, wherein the first active layer and the second active layer overlap each other.

13. The display device according to claim 10, wherein, when a spacing distance from the lower gate electrode to the first contact hole is denoted by L4 and a spacing distance from the lower gate electrode to the second contact hole is denoted by L3, L4 is set to be greater than L3.

14. The display device according to claim 10, wherein each of the source and drain regions of the first active layer and the source and drain regions of the second active layer is doped using a dopant and includes a conductorized region.

15. The display device according to claim 14, wherein when a length of the conductorized region of the first active layer in a channel direction is denoted by L1 and a length of the conductorized region of the second active layer in the channel direction is denoted by L2, L1 is set to be greater than L2.

16. The display device according to claim 14, wherein the dopant comprises at least one of boron (B), phosphorus (P), fluorine (F), or hydrogen (H).

17. The display device according to claim 10, wherein each of the first active layer and the second active layer comprises an oxide semiconductor.

18. The display device according to claim 10, wherein a value of driving current of the driving transistor of the pixel unit is greater than a value of driving current of the switching transistor of the pixel unit, wherein the value of the driving current corresponds to a saturation region in an Ids-Vgs curve.

19. The display device according to claim 10, wherein a value of a ratio of variation in current to variation in voltage of the driving transistor of the pixel unit is greater than a S-factor of the switching transistor of the pixel unit, wherein the value is a S-factor.

* * * * *